United States Patent
Lövskog

(10) Patent No.: US 8,093,708 B2
(45) Date of Patent: Jan. 10, 2012

(54) SEMICONDUCTOR PACKAGE HAVING NON-UNIFORM CONTACT ARRANGEMENT

(75) Inventor: J. Thomas Lövskog, Kävlinge (SE)

(73) Assignee: Sony Ericsson Mobile Communications AB, Lund (SE)

( * ) Notice: Subject to any disclaimer, the term of this patent is extended or adjusted under 35 U.S.C. 154(b) by 176 days.

(21) Appl. No.: 12/497,725

(22) Filed: Jul. 6, 2009

(65) Prior Publication Data

US 2011/0001231 A1   Jan. 6, 2011

(51) Int. Cl.
*H01L 23/48* (2006.01)
*H01L 23/50* (2006.01)

(52) U.S. Cl. ......... 257/693; 257/698; 257/778; 257/786

(58) Field of Classification Search .......... 257/693, 257/E23.012, 698, 778, 786, E23.079
See application file for complete search history.

(56) References Cited

U.S. PATENT DOCUMENTS

| | | | |
|---|---|---|---|
| 5,942,795 A | 8/1999 | Hoang | |
| 6,093,942 A * | 7/2000 | Sei et al. | 257/203 |
| 6,225,702 B1 | 5/2001 | Nakamura | |
| 7,884,473 B2 * | 2/2011 | Chen et al. | 257/741 |
| 2004/0003941 A1 | 1/2004 | Duxbury et al. | |
| 2004/0212103 A1 | 10/2004 | Kwong et al. | |
| 2008/0191345 A1 * | 8/2008 | Na et al. | 257/737 |
| 2008/0248612 A1 * | 10/2008 | Delp | 438/109 |
| 2009/0223043 A1 * | 9/2009 | Hsu et al. | 29/830 |
| 2011/0001230 A1 * | 1/2011 | Li et al. | 257/693 |

FOREIGN PATENT DOCUMENTS

| | | |
|---|---|---|
| DE | 19809509 | 3/1999 |
| EP | 1434473 | 6/2004 |

OTHER PUBLICATIONS

International Search Report and Written Opinion from corresponding International Application No. PCT/IB10/000003.

* cited by examiner

*Primary Examiner* — Evan Pert
(74) *Attorney, Agent, or Firm* — Renner, Otto, Boisselle & Sklar, LLP

(57) ABSTRACT

A semiconductor package has a non-uniform contact arrangement in which clustered contacts (e.g., a group of ground contacts, a group of power contacts, and/or a group of heatslug contacts) are placed closer together than I/O contacts. In one embodiment, I/O contacts near a cluster have a pitch in at least one direction that is larger than other I/O contacts. A local increase in the pitch of I/O contacts may be used to increase the line width and/or spacing of traces that fan out from corresponding pads on a printed circuit board.

15 Claims, 2 Drawing Sheets

SEMICONDUCTOR PACKAGE HAVING NON-UNIFORM CONTACT ARRANGEMENT

TECHNICAL FIELD OF THE INVENTION

The technology of the present disclosure relates generally to semiconductor packages and, more particularly, to a semiconductor package having a non-uniform arrangement of contacts.

BACKGROUND

Semiconductor packages are popularly used to house integrated circuits. Typical semiconductor packages include chip scale packages (CSPs) and ball grid arrays (BGAs). The semiconductor packages may include contacts to establish electrical connectivity between the integrated circuit and external components. For example, the semiconductor packages may include contact balls or bumps (e.g., solder bumps) to electrically and physically connect the semiconductor package to a printed circuit board (PCB). Typically, the contacts are electrically and physically mounted to copper pads on the PCB. PCBs with semiconductor packages tend to be included in electronic devices, such as mobile telephones and the like.

The contacts of conventional CSPs and BGAs are arranged in a symmetrical matrix. This is illustrated in FIG. 1, where a portion of a semiconductor package 100 having ball-type contacts 102 is illustrated. While there may be an occasional missing contact (e.g., designated by region 104) and/or rows and columns of contacts 102 may only be present at the periphery of the package 100 (e.g., a center region of the package does not have contacts such that the contacts generally form a square or rectangle), the contacts 102 are arranged in a uniform pitch in an X direction and in a uniform pitch in a Y direction. The X and Y direction pitches are typically the same, but may differ. Industry standard pitches range from 0.4 millimeters (mm) to 0.8 mm, and 0.3 mm pitches have been proposed.

With additional reference to FIGS. 2 and 3, shown is a portion of the package 100 as mounted on a PCB 106 by connection of the contacts 102 to pads 108. The size of the pads 108 may range from about 230 micrometers (μm) to about 350 μm and may have a pitch that corresponds to the contacts (e.g., about 0.4 mm to about 0.8 mm). Conductive traces 110 on the surface of the PCB 106 or sandwiched between layers of the PCB 106 may connect the pads 108 to other components. The routing (also referred to as "fan out") of the traces 110 is made in accordance with the location of the contacts 102 and pads 108. Conventional trace width and isolation of the traces 110 may range from about forty μm to about one hundred μm.

Contacts 102 may be used to couple the integrated circuit in the package 100 to other components so as to exchange signals. These contacts 102 may be referred to as input/output (I/O) contacts and are labeled I/O in the illustrated example. Other contacts 102 may be used to couple the integrated circuit in the package 100 to ground (e.g., ground contacts in the illustrated example are labeled GND), to power (e.g., power contact in the illustrated example are labeled Vcc), to a heat sink or heatslug (heatslug contacts are not shown in the illustrated example), or to some other point. Ground contacts, power contacts, and heatslug contacts are often placed in respective clusters that are internally connected in the package 100.

SUMMARY

The uniform pitch of semiconductor package contacts leads to constraints in the size and fan out arrangement of traces leading to I/O contacts and other contact types. To ease crowding of traces and increase trace size and spacing, the present disclosure describes a semiconductor package with a non-uniform contact arrangement in which clustered contacts (e.g., a group of ground contacts, a group of power contacts, and/or a group of heatslug contacts) are placed closer together than I/O contacts. In one embodiment, I/O contacts near a cluster have a pitch in at least one direction that is larger than other I/O contacts. In this manner, a local increase in the pitch of I/O contacts may be used to ease routing constraints. The clustered contacts that are closely arranged may be internally connected. Therefore, shorting of the contacts on the package and/or shorting of the corresponding pads on the corresponding PCB may be tolerated.

According to one aspect of the disclosure, a semiconductor package includes a cluster of two or more contacts; and a plurality of input/output (I/O) contacts, wherein the clustered contacts are positioned closer to each other than the I/O contacts are positioned to each other.

According to one embodiment of the semiconductor package, a pitch of the clustered contacts is smaller than a pitch of the I/O contacts.

According to one embodiment of the semiconductor package, a pitch of I/O contacts adjacent the cluster is larger than a pitch of I/O contacts that are not adjacent the cluster.

According to one embodiment of the semiconductor package, the clustered contacts are electrically connected internal to the semiconductor package.

According to one embodiment of the semiconductor package, the clustered contacts are ground contacts.

According to one embodiment of the semiconductor package, the clustered contacts are power contacts.

According to one embodiment of the semiconductor package, the clustered contacts are heatslug contacts.

According to one embodiment of the semiconductor package, the semiconductor package is mounted to a printed circuit board by connection of the contacts to pads of the printed circuit board, the pads having a layout corresponding to the positions of the semiconductor package contacts.

According to one embodiment of the semiconductor package, the printed circuit board includes traces that fan out from the pads, the traces corresponding to I/O contacts that are adjacent the contact cluster having at least one of increased line width or spacing than traces corresponding to I/O contacts that are not adjacent the contact cluster.

According to another aspect of the disclosure, a printed circuit board includes a plurality of pads for connecting to contacts of a semiconductor package, the pads having a layout corresponding to positions of the semiconductor package contacts and wherein the semiconductor package contacts include a cluster of two or more contacts and a plurality of input/output (I/O) contacts that are arranged so that the clustered contacts are positioned closer to each other than the I/O contacts are positioned to each other; and a plurality of traces that fan out from the pads, the traces corresponding to I/O contacts that are adjacent the contact cluster having at least one of increased line width or spacing than traces corresponding to I/O contacts that are not adjacent the contact cluster.

According to one embodiment of the printed circuit board, a pitch of the clustered contacts is smaller than a pitch of the I/O contacts.

According to one embodiment of the printed circuit board, a pitch of I/O contacts adjacent the cluster is larger than a pitch of I/O contacts that are not adjacent the cluster.

According to one embodiment of the printed circuit board, the clustered contacts are electrically connected internal to the semiconductor package.

According to one embodiment of the printed circuit board, the clustered contacts are ground contacts.

According to one embodiment of the printed circuit board, the clustered contacts are power contacts.

According to one embodiment of the printed circuit board, the clustered contacts are heatslug contacts.

These and further features will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the scope of the claims appended hereto.

Features that are described and/or illustrated with respect to one embodiment may be used in the same way or in a similar way in one or more other embodiments and/or in combination with or instead of the features of the other embodiments.

DETAILED DESCRIPTION OF EMBODIMENTS

Figure 1:
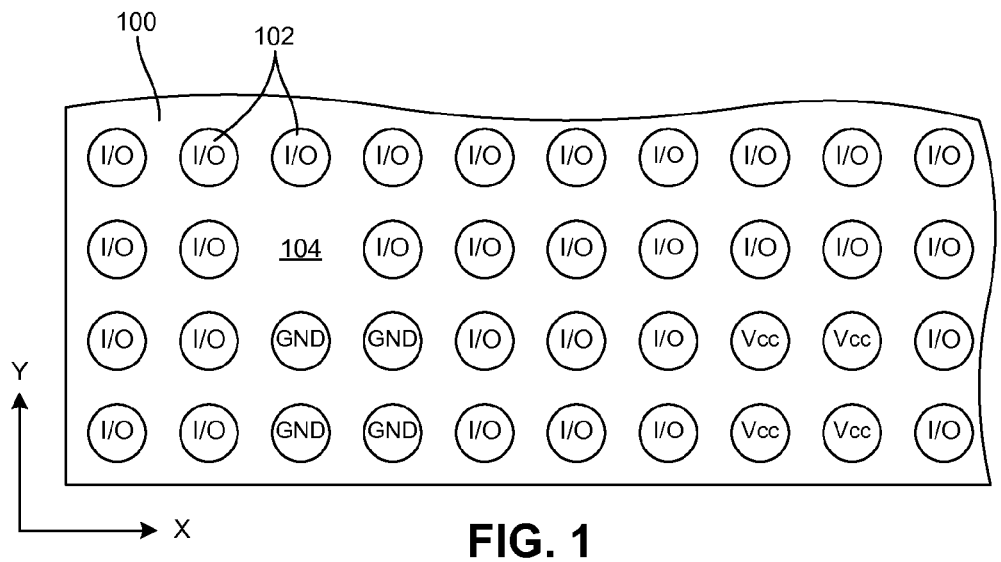
FIG. 1 is a schematic view of a portion of a conventional semiconductor package.

Embodiments will now be described with reference to the drawings, wherein like reference numerals are used to refer to like elements throughout. It will be understood that the figures are not necessarily to scale.

Figure 4:
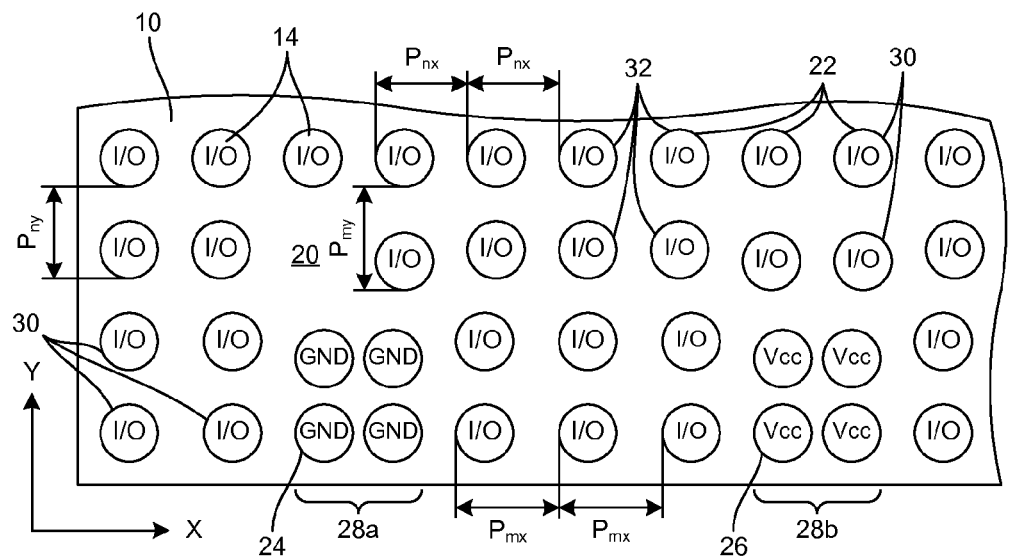
FIG. 4 is a schematic view of a portion of an exemplary semiconductor package with a non-uniform contact arrangement.
Figure 5:
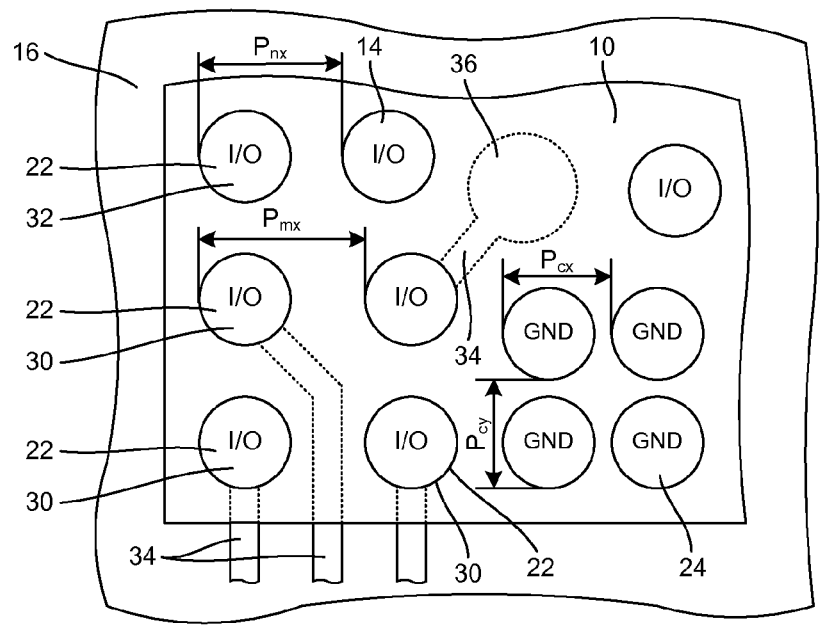
FIGS. 5 and 6 are respectively a schematic aerial view and a schematic side view of a portion of the package of FIG. 4 as mounted on a printed circuit board.
Figure 6:
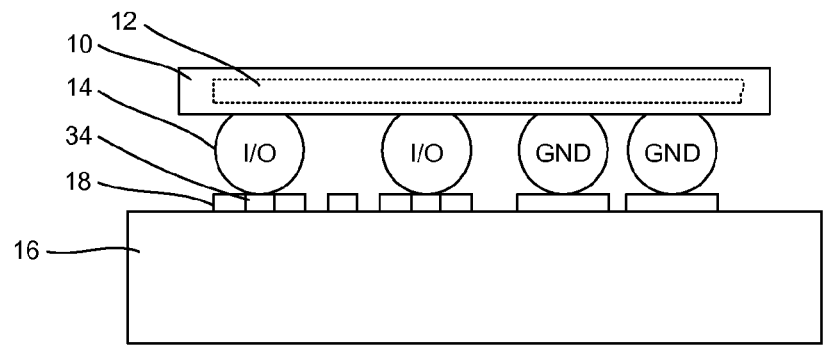

Referring to FIGS. 4-6, shown are representative portions of a semiconductor package 10 that includes an integrated circuit (IC) 12. The integrated circuit 12 may be connected to one or more power supplies, a ground, a heat sink (also referred to as a heatslug), and other components for exchanging signals with the other components. The package 10 may be, for example, a chip scale package (CSP) (e.g., a wafer-level CSP or a wafer level package), or a ball grid array (BGA). The package 10 may include contacts 14 through which the connections from the integrated circuit 12 to external points are made. Exemplary types of contacts 14 include, but are not limited to, bumps, solder balls, pins, pads, etc. The integrated circuit 12 may be integrally formed with the contacts 14 or internal wiring of the package 10 may operatively connect the contacts 14 with the integrated circuit 12.

The integrated circuit 12 may be configured to perform any desired functionality. For instance, the integrated circuit 12 may be or include a general purpose processor for executing logical instructions in the form of software, a microcontroller, an application specific integrated circuit (ASIC), etc. Other exemplary integrated circuits 12 may be configured as data storage memory (e.g., a flash memory) and/or system memory (e.g., random access memory or RAM). The package 10 may be incorporated into any type of electronic device including, but not limited to, a mobile telephone, an ultra-mobile personal computer, a computer, a media player (e.g., an MP3 player), or other type of device.

With continuing reference to FIGS. 4, 5 and 6, the package 10 may be mounted to a printed circuit board (PCB) 16. For instance, the contacts 14 may be electrically connected and/or physically secured to pads 18 formed on the PCB 14.

The contacts 12 of the package 10 are arranged in an asymmetrical matrix. This is illustrated by example in the appended figures where a portion of the semiconductor package 10 having ball-type contacts 14 is illustrated. The contacts 14 may be arranged in rows and columns, but an X-direction pitch and/or a Y-direction pitch of contacts 14 may vary within one or more of the rows and/or within one of more of the columns. Also, there may be an occasional missing contact (e.g., designated by region 20) and/or rows and columns of contacts 14 may only be present at the periphery of the package 10 (e.g., a center region of the package does not have contacts such that the contacts generally form a square or rectangle). Even if a contact is missing, the remaining contacts may be positioned in accordance with predetermined pitches as if the missing contact were present.

Some of the contacts 14 may be used to couple the integrated circuit 12 in the package 10 to other components so as to exchange signals. These contacts 14 may be referred to as input/output (I/O) contacts 22 and are labeled "I/O" in the appended figures. Other contacts 14 may be used to couple the integrated circuit 12 in the package 10 to ground (e.g., GND) and may be referred to ground contacts 24. Other contacts 14 may be used to couple the integrated circuit 12 to power (e.g., Vcc) and may be referred to as power contacts 26. Another exemplary contact type relates to contacts 12 that are used to couple the integrated circuit 12 to a heat sink or heatslug. Heatslug contacts are not shown in the illustrated example.

Ground contacts 24, power contacts 26, and heatslug contacts are often placed in respective groups to form contact clusters 28. Each cluster 28 contains contacts 12 of the same contact type, and those contacts may be internally connected in the package 10. In the illustrated embodiment there is a first cluster 28a having ground contacts 24 and another cluster 28b having power contacts 26. A cluster of heatslug contacts also is possible. The same type contacts in each cluster 28 are placed adjacent one another without I/O contacts 22 or other types of contacts therebetween.

Each of the I/O contacts 22 may be further classified as being adjacent one of the clusters 28 or not adjacent one of the clusters 28. I/O contacts 22 that are adjacent one of the clusters 28 (adjacent I/O contacts 30) may be considered I/O contacts 22 that are next to a contact from one of the clusters 28 and with no more than a predetermined number of other intervening contacts 14 between the contact in question and the contact of the cluster 28 in one or both of the X-direction or the Y-direction. The predetermined number may be, for example, zero (e.g., no intervening contacts 14), one (e.g., up to one intervening I/O contact 22 may be present between the contact in question and the contact of the cluster 28), or two (e.g., up to two intervening I/O contacts 22 may be present between the contact in question and the contact of the cluster 28). I/O contacts 22 that are not adjacent one of the clusters 28 (non-adjacent I/O contacts 32) may be considered I/O contacts 22 that have more than the predetermined number of contacts between the contact in question and the contact of the cluster 28 in one or both of the X-direction or the Y-direction. In the illustrated example and the description that follows, the predetermined number will be assumed to be one.

The contacts 14 may be arranged in different densities on the package 10 depending on whether the contacts 14 are members of one of the clusters 28, are I/O contacts 30 that are adjacent one of the clusters 28, or are I/O contacts 32 that are not adjacent one of the clusters 28. Contacts 14 that are in one of the clusters 28 may be arranged with the highest density of contacts relative to the unit area of the package 10. Adjacent I/O contacts 30 may take advantage of extra space resulting from the relatively close spacing of the contacts 14 in the nearby cluster 28. In this manner, the adjacent I/O contacts 30 may be spread apart from one another so as to be arranged with the lowest density of contacts relative to the unit area of the package 10. Non-adjacent I/O contact 32 may be arranged with a customary regular pitch and may be arranged with a density that is between the contacts of the cluster 28 and the adjacent I/O contacts 30.

In one embodiment, the various densities of contacts 14 may be achieved using predetermined X-direction pitches and predetermined Y-direction pitches for contacts 14 of the various categories, including contacts 14 in the clusters 28, adjacent I/O contacts 30, and non-adjacent I/O contacts 32.

Focusing on the X-direction, an X-direction pitch for the contacts 14 in the cluster 28 (or $P_{cx}$ for "cluster pitch" in the X-direction) may be established. An exemplary range for $P_{cx}$ may be about 0.2 mm to about 0.5 mm. Another exemplary range for $P_{cx}$ may be about 1.1 times the X-direction width of the contact 14 to about 2.0 times the X-direction width of the contact 14. In addition, an X-direction pitch for the I/O contacts 32 that are not adjacent the cluster 28 (or $P_{nx}$ for "normal pitch" in the X-direction) may be established. An exemplary range for $P_{nx}$ may be about 0.3 mm to about 0.8 mm. In addition, an X-direction pitch for the I/O contacts 30 that are adjacent the cluster 28 in the X-direction (or $P_{mx}$ for "modified pitch" in the X-direction) may be established. An exemplary range for $P_{mx}$ may be about 0.4 mm to about 1.2 mm.

Focusing on the Y-direction, a Y-direction pitch for the contacts 14 in the cluster 28 (or $P_{cy}$ for "cluster pitch" in the Y-direction) may be established. An exemplary range for $P_{cy}$ may be about 0.2 mm to about 0.5 mm. Another exemplary range for $P_{cy}$ may be about 1.1 times the Y-direction width of the contact 14 to about 2.0 times the Y-direction width of the contact 14. $P_{cy}$ may be the same or different than $P_{cx}$. In addition, a Y-direction pitch for the I/O contacts 32 that are not adjacent the cluster 28 (or $P_{ny}$ for "normal pitch" in the Y-direction) may be established. An exemplary range for $P_{ny}$ may be about 0.3 mm to about 0.8 mm. $P_{ny}$ may be the same or different than $P_{nx}$. In addition, a Y-direction pitch for the I/O contacts 30 that are adjacent the cluster 28 in the Y-direction (or $P_{my}$ for "modified pitch" in the Y-direction) may be established. An exemplary range for $P_{my}$ may be about 0.4 mm to about 1.2 mm. $P_{my}$ may be the same or different than $P_{mx}$.

In one embodiment, $P_{cx}$ may be less than $P_{nx}$; $P_{nx}$ may be less than $P_{mx}$; $P_{cy}$ may be less than $P_{ny}$; and/or $P_{ny}$ may be less than $P_{my}$. As a result, I/O contacts 22 may have areas in which the pitch of the I/O contacts 22 is locally increased. These areas of local pitch increases may be next to contact clusters 28 in the X-direction and/or the Y-direction. There may be a minimum distance between any I/O contact 22 and contacts of the clusters 28.

Figure 2:
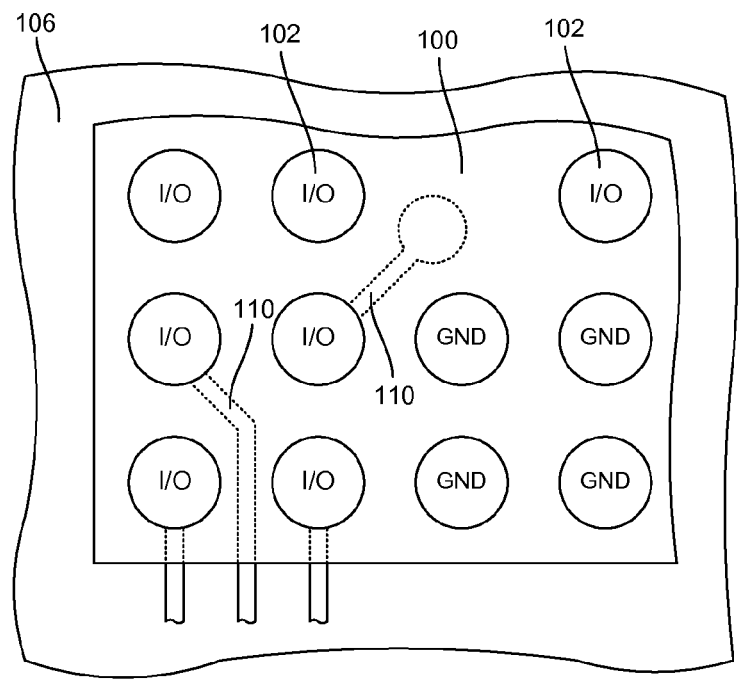
FIGS. 2 and 3 are respectively a schematic aerial view and a schematic side view of a portion of the package of FIG. 1 as mounted on a printed circuit board.
Figure 3:
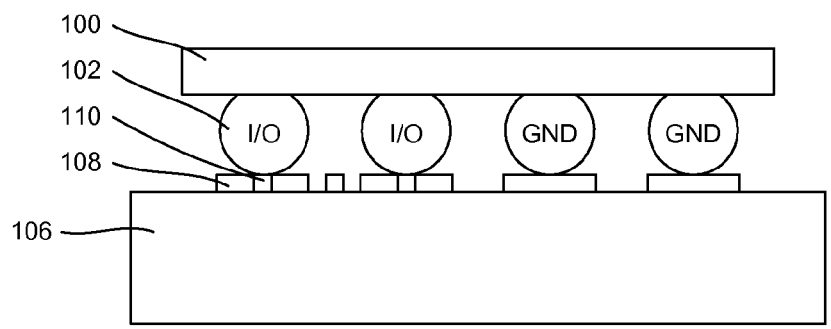

The local increase in I/O contact 22 density may be used to ease fan-out constraints. For instance, the pads 18 may be arranged to correspond to the respective locations of the contacts 14. As such, the pads 18 corresponding to adjacent I/O contacts 30 (or "adjacent pads") may have an increased pitch in at least one direction as compared to pads 18 corresponding to non-adjacent I/O contacts 32 (or "non-adjacent pads"). For instance, adjacent pads may have an X-direction pitch equaling or corresponding to $P_{mx}$ and/or adjacent pads may have a Y-direction pitch equaling or corresponding to $P_{my}$. In comparison, non-adjacent pads may have an X-direction pitch equaling or corresponding to $P_{nx}$ and/or non-adjacent pads may have a Y-direction pitch equaling or corresponding to $P_{ny}$. In this manner, there also may be a corresponding increase in space between pads 16 that have the larger pitch. This space may accommodate conductive traces 34 that are wider and/or that are laid out with more spacing between traces 34 than traces 34 that connect to non-adjacent pads 16, which do not have as much space therebetween. In addition, available space on the PCB 16 in the area of the adjacent contacts 30 may allow for increasing the size and/or space between the pads 16, interconnects, vias, planes, and other structures. For example, circular structure 36 (FIG. 5) may be larger than a similar structure formed under the conventional approach (FIG. 2).

Although certain embodiments have been shown and described, it is understood that equivalents and modifications falling within the scope of the appended claims will occur to others who are skilled in the art upon the reading and understanding of this specification.

What is claimed is:

1. A semiconductor assembly, comprising:
   a semiconductor package comprising:
   a cluster of two or more contacts; and
   a plurality of input/output (I/O) contacts, wherein the clustered contacts are positioned closer to each other than the I/O contacts are positioned to each other, wherein the clustered contacts are electrically connected internal to the semiconductor package; and
   a printed circuit board, wherein the semiconductor package is mounted to the printed circuit board by connection of the contacts to pads of the printed circuit board, the pads having a layout corresponding to the positions of the semiconductor package contacts and the printed circuit board includes traces that fan out from the pads, the traces corresponding to I/O contacts that are adjacent the contact cluster having at least one of increased line width or spacing than traces corresponding to I/O contacts that are not adjacent the contact cluster.

2. The semiconductor assembly of claim 1, wherein a pitch of the clustered contacts is smaller than a pitch of the I/O contacts.

3. The semiconductor assembly of claim 2, wherein a pitch of I/O contacts adjacent the cluster is larger than a pitch of I/O contacts that are not adjacent the cluster.

4. The semiconductor assembly of claim 1, wherein a pitch of I/O contacts adjacent the cluster is larger than a pitch of I/O contacts that are not adjacent the cluster.

5. The semiconductor assembly of claim 1, wherein the clustered contacts are ground contacts.

6. The semiconductor assembly of claim 1, wherein the clustered contacts are power contacts.

7. The semiconductor assembly of claim 1, wherein the clustered contacts are heatslug contacts.

8. A printed circuit board, comprising:
   a plurality of pads for connecting to contacts of a semiconductor package, the pads having a layout corresponding to positions of the semiconductor package contacts and wherein the semiconductor package contacts include a cluster of two or more contacts and a plurality of input/output (I/O) contacts that are arranged so that the clustered contacts are positioned closer to each other than the I/O contacts are positioned to each other; and
   a plurality of traces that fan out from the pads, the traces corresponding to I/O contacts that are adjacent the contact cluster having at least one of increased line width or spacing than traces corresponding to I/O contacts that are not adjacent the contact cluster.

9. The printed circuit board of claim 8, wherein a pitch of the clustered contacts is smaller than a pitch of the I/O contacts.

10. The printed circuit board of claim 9, wherein a pitch of I/O contacts adjacent the cluster is larger than a pitch of I/O contacts that are not adjacent the cluster.

11. The printed circuit board of claim 8, wherein a pitch of I/O contacts adjacent the cluster is larger than a pitch of I/O contacts that are not adjacent the cluster.

12. The printed circuit board of claim 8, wherein the clustered contacts are electrically connected internal to the semiconductor package.

13. The printed circuit board of claim 8, wherein the clustered contacts are ground contacts.

14. The printed circuit board of claim 8, wherein the clustered contacts are power contacts.

15. The printed circuit board of claim 8, wherein the clustered contacts are heatslug contacts.

* * * * *